(12) United States Patent
Maguire

(10) Patent No.: US 9,541,844 B2
(45) Date of Patent: Jan. 10, 2017

(54) METHOD AND APPARATUS FOR CALIBRATING A PROJECTED IMAGE MANUFACTURING DEVICE

(75) Inventor: Michael Christopher Maguire, Napa, CA (US)

(73) Assignee: Rolls-Royce Corporation, Indianapolis, IN (US)

(*) Notice: Subject to any disclaimer, the term of this patent is extended or adjusted under 35 U.S.C. 154(b) by 1018 days.

(21) Appl. No.: 12/853,216

(22) Filed: Aug. 9, 2010

(65) Prior Publication Data

US 2011/0037848 A1   Feb. 17, 2011

Related U.S. Application Data

(60) Provisional application No. 61/232,456, filed on Aug. 9, 2009.

(51) Int. Cl.
*G03F 7/00*   (2006.01)
*G03F 7/20*   (2006.01)
*B29C 67/00*  (2006.01)

(52) U.S. Cl.
CPC ......... *G03F 7/70416* (2013.01); *B29C 67/007* (2013.01); *G03F 7/70516* (2013.01)

(58) Field of Classification Search
CPC .................................................. G03F 7/70416
USPC . 348/86, 95, 94; 382/141, 151; 700/95–212; 359/458
See application file for complete search history.

(56) References Cited

U.S. PATENT DOCUMENTS

| 4,660,981 | A  |   | 4/1987  | Stridsberg |
| 4,676,631 | A  | * | 6/1987  | Kosugi et al. ................ 355/55 |
| 4,907,021 | A  | * | 3/1990  | Yabu ............................. 353/101 |
| 5,059,021 | A  | * | 10/1991 | Spence et al. ................ 356/121 |
| 5,123,734 | A  | * | 6/1992  | Spence et al. ................ 356/121 |
| 5,430,666 | A  |   | 7/1995  | DeAngelis et al. |
| 5,832,415 | A  | * | 11/1998 | Wilkening et al. ............. 702/86 |
| 5,945,239 | A  | * | 8/1999  | Taniguchi ........................ 430/30 |
| 6,483,596 | B1 | * | 11/2002 | Philippi et al. ............... 356/614 |
| H2114     | H  | * | 2/2005  | Novak et al. ................. 356/124 |
| 7,068,825 | B2 |   | 6/2006  | Rubbert et al. |
| 7,239,932 | B2 |   | 7/2007  | Farnworth |
| 7,305,110 | B2 |   | 12/2007 | Rubbert et al. |

(Continued)

FOREIGN PATENT DOCUMENTS

WO    WO 94/15265    7/1994

OTHER PUBLICATIONS

International Search Report and Written Opinion, PCT/US2010/044920, Nov. 12, 2010, Rolls-Royce Corporation.

*Primary Examiner* — Dave Czekaj
*Assistant Examiner* — Shanika Brumfield
(74) *Attorney, Agent, or Firm* — Shumaker & Sieffert, P.A.

(57) ABSTRACT

A method for calibrating a manufacturing device that manufactures solid parts by projecting images onto a photocurable substrate includes providing the manufacturing device including a projector and an optical train, positioning an imaging plate at a manufacturing position relative to the manufacturing device, and providing a contrasting image on the imaging plate. The method further includes projecting a test image from the projector through the optical train onto the contrasting image and calibrating the projector and/or the optical train in response to the test image projected onto the contrasting image. The method further includes manufacturing a solid component with the manufacturing device after the calibrating.

22 Claims, 1 Drawing Sheet

(56) References Cited

U.S. PATENT DOCUMENTS

| | | | |
|---|---|---|---|
| 2002/0041377 A1* | 4/2002 | Hagiwara et al. | 356/399 |
| 2007/0032896 A1* | 2/2007 | Ye et al. | 700/108 |
| 2007/0260419 A1* | 11/2007 | Hagiwara | 702/150 |
| 2008/0169586 A1* | 7/2008 | Hull et al. | 264/401 |
| 2008/0237507 A1* | 10/2008 | Enomoto | 250/582 |
| 2009/0051935 A1* | 2/2009 | Cooper | B23K 33/00 356/616 |
| 2009/0060386 A1* | 3/2009 | Cooper | B23K 33/00 382/294 |
| 2011/0001973 A1* | 1/2011 | Polidor | G01B 9/08 356/393 |

* cited by examiner

METHOD AND APPARATUS FOR CALIBRATING A PROJECTED IMAGE MANUFACTURING DEVICE

CROSS REFERENCE TO RELATED APPLICATIONS

The present application claims the benefit of U.S. Provisional Patent Application 61/232,456, filed Aug. 9, 2009, and is incorporated herein by reference.

BACKGROUND

The technical field relates generally to calibrating projected image manufacturing devices. Projected image manufacturing devices include devices that project an image onto a photo-curable substrate to create solid objects or layers of solid objects. The projected images are typically based upon computer files with instructions for the image to be projected, but are subject to variance according to the physical hardware of the manufacturing device, including the characteristics of the projector and any downstream optical components (the optical train) including lenses, prisms, mirrors, and/or other optical components. In the presently available art, the electronic build file is loaded into the device and a solid component is manufactured. The component is measured, and adjustments are made to the electronic build file to create a component having the proper shape and dimensions. Many presently available techniques are time-consuming and iterative, and require that separate electronic build files are created for each manufacturing device. Therefore, further technological developments are desirable in this area.

SUMMARY

One embodiment is a unique method for calibrating a projected image manufacturing device. Further embodiments, forms, objects, features, advantages, aspects, and benefits shall become apparent from the following description and drawings.

DESCRIPTION OF THE ILLUSTRATIVE EMBODIMENTS

Figure 1:
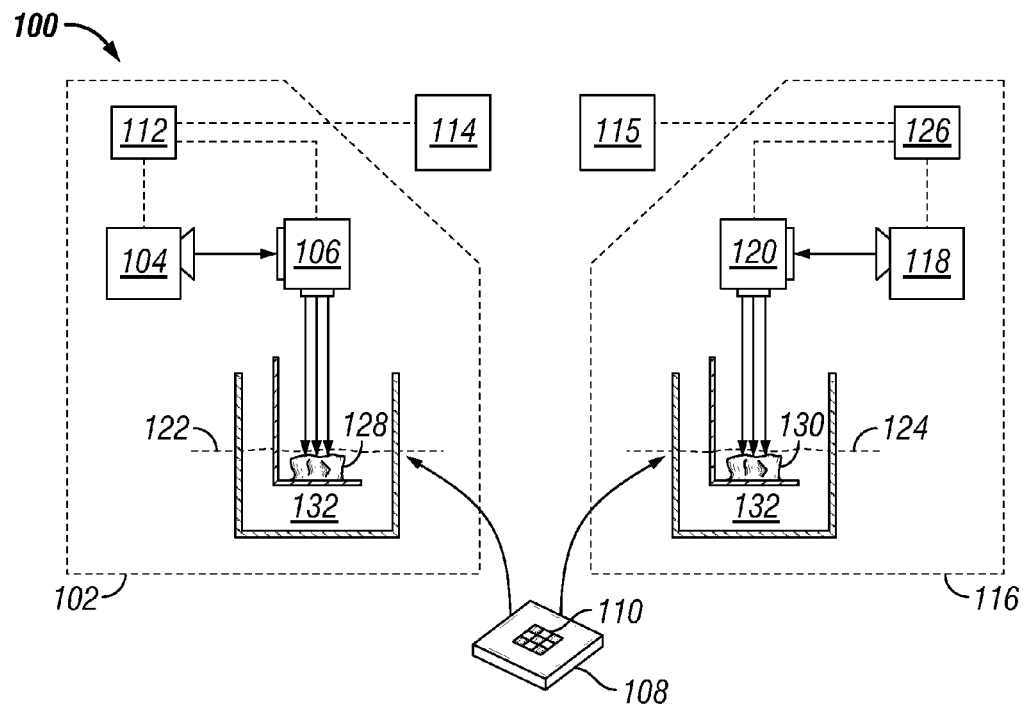
FIG. 1 is a schematic diagram of a system for calibrating a projected image manufacturing device.

For the purposes of promoting an understanding of the principles of the invention, reference will now be made to the embodiments illustrated in the drawings and specific language will be used to describe the same. It will nevertheless be understood that no limitation of the scope of the invention is thereby intended, any alterations and further modifications in the illustrated embodiments, and any further applications of the principles of the invention as illustrated therein as would normally occur to one skilled in the art to which the invention relates are contemplated herein.

FIG. 1 illustrates an apparatus 100 including a manufacturing device 102 having a projector 104 and an optical train 106. The manufacturing device 102 includes a controller 112 that reads an electronic build file 114 and commands the manufacturing device 102 to build a first solid component 128 from the electronic build file 114. The optical train 106 includes any optical devices between the projector 104 and the manufacturing surface 122, including any lenses, prisms, mirrors, or other optical devices that change the projected image between the projector 104 and the manufactured surface 122. The manufacturing device 102 may be any manufacturing device utilizing a projected image in the manufacturing process, including a stereo-lithographic device, a device that projects an image into a photo-curable substrate 132 to form layers of a solid component 128, or other device known in the art. The apparatus 100 further includes an imaging plate 108 having a contrasting image 110 and positioned at a manufacturing position 122 relative to the manufacturing device 102. The manufacturing position 122 includes the position having the same optical environment relative to the projector 104 and optical train 106 as the manufactured component 128, i.e. the position where the image is projected during the manufacturing process, which is at the same level as the surface of the photo-curable substrate 132 during manufacture.

The apparatus further includes a means for calibrating the projector 104 and/or the optical train 106 to achieve a proper magnification, skew, and parallelism of a projected image in relation to the contrasting image 110.

Figures 2A, 2B:
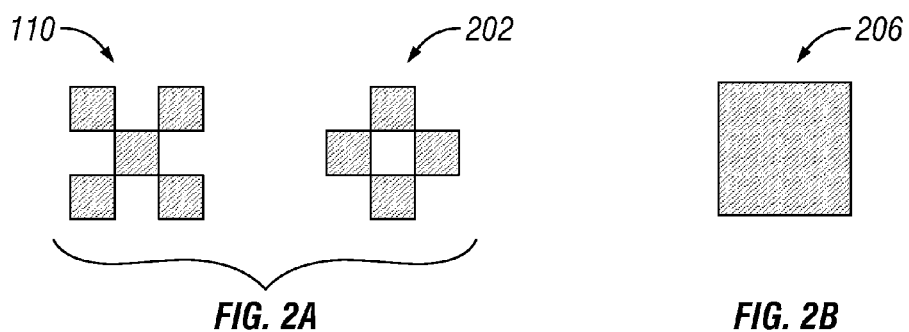
FIG. 2A is an illustration of an exemplary test image and contrasting image.
FIG. 2B is an illustration of the exemplary test image projected onto the contrasting image.

Examples of a means for calibrating include placing the contrasting image 110 at the manufacturing position 122, projecting a test image onto the contrasting image 110, and tuning the projector 104 and/or optical train 106 until the test image and the contrasting image 110 are within sufficient registration. Referencing FIG. 2A, a contrasting image 110 and a test image 202 are illustrated. The test image 202 is projected onto the contrasting image 110, and when the test image 202 and contrasting image 110 are fully registered, with no white areas shown, straight lines along the edges, and having the same horizontal and vertical extent, the projector 104 has the proper magnification, skew, and paralleleism. The fully registered image 206 is illustrated in FIG. 2B.

Figures 3A, 3B:
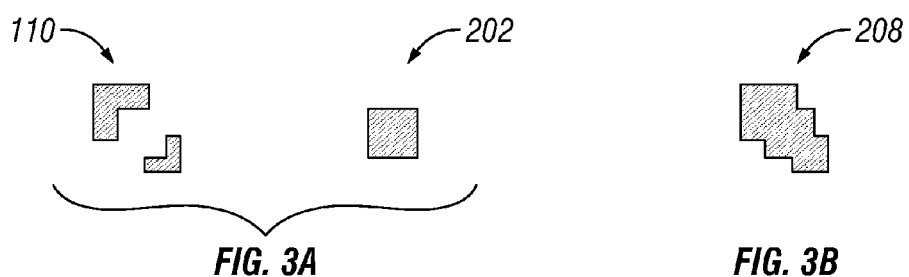
FIG. 3A is an illustration of a second exemplary test image and contrasting image.
FIG. 3B is an illustration of the second exemplary test image projected onto the contrasting image.

Another example, referencing FIG. 3A, includes a contrasting image 110 and a test image 202. The test image 202 is projected onto the contrasting image 110, and when the test image 202 fits correctly within the contrasting image 110 such that the white space is just removed, and the lines of the test image 202 are parallel with the lines of the contrasting image 110, the projector 104 has the proper magnification, skew, and parallelism. The fully registered image 208 is illustrated in FIG. 3B.

The contrasting image 110 can include a negative of the test image 202, and a neutral background (e.g. black or another color) is produced when the test image 202 and contrasting image 110 are fully registered. In another example, the contrasting image 110 and the test image 202 include fixed complementary grids. The means for calibrating includes the contrasting image 110 as a negative of the test image 202, the contrasting image 110 as a partial negative of the test image 202, and/or the contrasting image 110 as a test grid. The positioning of the contrasting image 110 with the test image 202 allows convenient tuning of the skew, image parallelism, and image magnification until the registration is achieved.

In certain embodiments, the apparatus 100 further includes a second manufacturing device 116 including a second projector 118 and a second optical train 120, where the imaging plate 108 having the contrasting image 110 is positioned at a manufacturing position 124 relative to the second manufacturing device 116. The second manufacturing device 116 includes a controller 126 that reads a second electronic build file 115 and commands the second manufacturing device 116 to build a first solid component 128 from the second electronic build file 115. The build data for the second electronic build file 115 is identical to the build data for the first electronic build file 114. The second electronic build file 115 utilized by the second manufacturing device 116 may be the same electronic build file 114 utilized by the first manufacturing device 102, for example where the controllers 112, 126 read the file from a shared storage location. Alternatively, the second electronic build file 115 may be an identical build file 115 stored in a different location (e.g. on the individual controllers 112, 126), and/or an electronic build file 115 that includes identical build data but that is not an identical file (e.g. including differing file headers, names, or other non-build data parameters).

The apparatus 100 further includes means for calibrating the second projector 118 and/or the second optical train 120 to achieve a proper magnification, skew, and parallelism of a second projected image in relation to the contrasting image.

Examples of a means for calibrating include placing the contrasting image 110 at the second manufacturing position 124, projecting a second test image onto the contrasting image 110, and tuning the projector 118 and/or optical train 120 until the second test image and the contrasting image 110 are within sufficient registration. For example, the contrasting image 110 can include a negative of the second test image, and a neutral background (e.g. black or another color) is produced when the second test image and contrasting image 110 are fully registered. In another example, the contrasting image 110 and the second test image include fixed complementary grids. The means for calibrating includes the contrasting image 110 as a negative of the second test image, the contrasting image 110 as a partial negative of the second test image, and/or the contrasting image 110 as a test grid. The positioning of the contrasting image 110 with the second test image allows convenient tuning of the skew, image parallelism, and image magnification until the registration is achieved.

The apparatus further includes a first solid component 128 manufactured on the manufacturing device 102 from a first electronic build file, a second solid component 130 manufactured on the second manufacturing device 116 from a second electronic build file. The first and second electronic build files include identical build data, and may be the same file or distinct files. In certain embodiments, the first and second solid components 128, 130 are identical physical parts to within a specified tolerance. In certain embodiments, the first and second solid components 128, 130 comprise components having the same part number—i.e. parts that are referenced as interchangeable parts by the manufacturer, and that are used interchangeably for production, replacement, and/or repair.

Certain exemplary operations for calibrating a projected image on a manufacturing device are described. Certain operations illustrated may be implemented by a computer executing a computer program product on a computer readable medium, where the computer program product comprises instructions causing the computer to execute one or more of the operations, or to issue commands to other devices to execute one or more of the operations.

A technique for calibrating a manufacturing imaging device includes an operation to provide a manufacturing device including a projector and an optical train, an operation to position an imaging plate at a manufacturing position relative to the manufacturing device, an operation to provide a contrasting image on the imaging plate, an operation to project a test image from the projector through the optical train onto the contrasting image, and an operation to calibrate at least one of the projector and the optical train in response to the test image projected onto the contrasting image. The contrasting image may be a negative of the test image. The technique further includes the operation to calibrate including correcting an image aspect such as the magnification, skew, and/or parallelism. The test image may be an image from a manufacturing build file, for example from the plan for a solid component, or an image that is a fixed grid.

The technique further includes an operation to manufacture a solid part with the manufacturing device by projecting images onto a photo-curable substrate after the calibrating, where the manufacturing position is an equivalent optical position with a surface of the photo-curable substrate. In certain embodiments, the technique further includes an operation to provide a second manufacturing device, and an operation to repeat the positioning, the providing the contrasting image, the projecting, and the calibrating with the second manufacturing device. The technique further includes an operation to manufacture a first solid part with the manufacturing device by interpreting images from a first electronic build file, and an operation to manufacture a second solid part with the second manufacturing device by interpreting images from a second electronic build file that includes identical build data to the first electronic build file.

In certain embodiments, the test image is a fixed grid, and the technique further includes an operation to manufacture a solid part with the manufacturing device by projecting images onto a photo-curable substrate after the calibrating. In an exemplary embodiment, the fixed grid includes a pattern resolution determined in response to a manufacturing tolerance of the solid part.

The technique further includes an operation to repeat the positioning, the providing the contrasting image, the projecting, and the calibrating in response to a calibration trigger. The calibration trigger includes any event wherein it may be desirable to re-calibrate the manufacturing device after the event. Exemplary events include an initial acquisition of the manufacturing device, a movement of the manufacturing device, an initial acquisition of a build file, a change in a build file, a replacement of a component of the manufacturing device (especially, but not limited, to the projector or a portion of the optical train). Further exemplary events include an off-nominal test of a component built by the manufacturing device (i.e. a component built by the device exhibits an off-nominal dimension, including but not limited to a dimension that is beyond a tolerance specification for the component), an elapsed time threshold since a last calibration event, and/or an elapsed number of components manufactured since a last calibration event.

Yet another exemplary embodiment is a technique for calibrating a manufacturing device that is structured to manufacture a solid part by projecting images onto a photo-curable substrate. The technique includes an operation to provide the manufacturing device including a projector and an optical train, an operation to position an imaging plate at a manufacturing position relative to the manufacturing device, an operation to provide a contrasting image on the imaging plate, an operation to project a test image from the projector through the optical train onto the contrasting image, an operation to calibrate at least one of the projector and the optical train in response to the test image projected onto the contrasting image, and an operation to manufacture a solid component with the manufacturing device after the calibrating. The technique further includes an operation to provide a second manufacturing device including a second projector and a second optical train, an operation to position the imaging plate at a manufacturing position relative to the second manufacturing device, an operation to project the test image from the second projector through the optical train onto the contrasting image, and an operation to calibrate at least one of the second projector and the second optical train in response to the test image projected onto the contrasting image. The technique further includes an operation to manufacture a second solid component with the second manufacturing device after the calibrating the at least one of the second projector and the second optical train. In certain embodiments, the solid component and the second solid component are manufactured from electronic build files comprising identical build data.

As is evident from the figures and text presented above, a variety of embodiments according to the present invention are contemplated.

An exemplary embodiment is a method including providing a manufacturing device including a projector and an optical train, positioning an imaging plate at a manufacturing position relative to the manufacturing device, providing a contrasting image on the imaging plate, projecting a test image from the projector through the optical train onto the contrasting image, and calibrating at least one of the projector and the optical train in response to the test image projected onto the contrasting image. The contrasting image may be a negative of the test image. The method includes the calibrating including correcting an image aspect such as the magnification, skew, and/or parallelism. The test image may be an image from a manufacturing build file or a fixed grid.

The exemplary method further includes manufacturing a solid part with the manufacturing device by projecting images onto a photo-curable substrate after the calibrating, where the manufacturing position is an equivalent optical position with a surface of the photo-curable substrate. In certain embodiments, the method further includes providing a second manufacturing device, and repeating the positioning, providing the contrasting image, projecting, and calibrating with the second manufacturing device. The method further includes manufacturing a first solid part with the manufacturing device by interpreting images from a first electronic build file, and manufacturing a second solid part with the second manufacturing device by interpreting images from a second electronic build file that includes identical build data to the first electronic build file.

In certain embodiments, the test image is a fixed grid, and the method includes manufacturing a solid part with the manufacturing device by projecting images onto a photo-curable substrate after the calibrating. In an exemplary embodiment, the fixed grid includes a pattern resolution determined in response to a manufacturing tolerance of the solid part.

The method further includes repeating the positioning, providing the contrasting image, projecting, and calibrating in response to a calibration trigger. The calibration trigger includes an initial acquisition of the manufacturing device, a movement of the manufacturing device, an initial acquisition of a build file, a change in a build file, a replacement of a component of the manufacturing device, an off-nominal test of a component built by the manufacturing device, an elapsed time threshold since a last calibration event, and/or an elapsed number of components manufactured since a last calibration event.

Another exemplary embodiment is an apparatus including a manufacturing device having a projector and an optical train, an imaging plate having a contrasting image and positioned at a manufacturing position relative to the manufacturing device, and a means for calibrating at least one of the projector and the optical train to achieve a proper magnification, skew, and parallelism of a projected image in relation to the contrasting image. The means for calibrating includes a test image and where the contrasting image can be a negative of the test image. The test image may be a fixed grid.

In certain embodiments, the apparatus includes a second manufacturing device including a second projector and a second optical train, where the imaging plate having the contrasting image is positioned at a manufacturing position relative to the second manufacturing device, and the apparatus includes a means for calibrating at least one of the second projector and the second optical train to achieve a proper magnification, skew, and parallelism of a second projected image in relation to the contrasting image.

The apparatus further includes a first solid component manufactured on the manufacturing device from a first electronic build file, a second solid component manufactured on the second manufacturing device from a second electronic build file, where the first and second electronic build files include identical build data. In certain embodiments, the first and second solid components are identical physical parts to within a specified tolerance.

Yet another exemplary embodiment is a method for calibrating a manufacturing device structured to manufacture a solid part by projecting images onto a photo-curable substrate, the method including providing the manufacturing device including a projector and an optical train, positioning an imaging plate at a manufacturing position relative to the manufacturing device, providing a contrasting image on the imaging plate, projecting a test image from the projector through the optical train onto the contrasting image, calibrating at least one of the projector and the optical train in response to the test image projected onto the contrasting image, and manufacturing a solid component with the manufacturing device after the calibrating. The method further includes providing a second manufacturing device including a second projector and a second optical train, positioning the imaging plate at a manufacturing position relative to the second manufacturing device, projecting the test image from the second projector through the optical train onto the contrasting image, and calibrating at least one of the second projector and the second optical train in response to the test image projected onto the contrasting image, and manufacturing a second solid component with the second manufacturing device after the calibrating the at least one of the second projector and the second optical train. In certain embodiments, the solid component and the second solid component are manufactured from electronic build files comprising identical build data.

While the invention has been illustrated and described in detail in the drawings and foregoing description, the same is to be considered as illustrative and not restrictive in character, it being understood that only certain exemplary embodiments have been shown and described and that all changes and modifications that come within the spirit of the inventions are desired to be protected. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A method comprising:
positioning an imaging plate at a manufacturing position relative to a manufacturing device, wherein the manufacturing device comprises a projector and an optical train, and wherein the imaging plate comprises a surface comprising a contrasting image;
projecting a test image from the projector through the optical train onto the surface comprising the contrasting image such that the test image is positioned with the contrasting image on the surface of the imaging plate; and
calibrating at least one of the projector or the optical train based on registration between the test image and the contrasting image,
wherein calibrating at least one of the projector or the optical train comprises tuning magnification, skew, and parallelism of the test image in relation to the contrasting image until registration between the test image and the contrasting image on the surface of the imaging plate is achieved before manufacturing a solid part with the manufacturing device.

2. The method of claim 1, wherein the contrasting image comprises a negative of the test image.

3. The method of claim 1, wherein the test image comprises an image from a manufacturing build file.

4. The method of claim 1, further comprising manufacturing the solid part with the manufacturing device by projecting images onto a photo-curable substrate after calibrating the at least one of the projector or the optical train.

5. The method of claim 4, wherein the manufacturing position comprises an equivalent optical position with a surface of the photo-curable substrate.

6. The method of claim 1, wherein the manufacturing position comprises a first manufacturing position, wherein the manufacturing device comprises a first manufacturing device, wherein the projector comprises a first projector, and wherein the optical train comprises a first optical train, the method further comprising:
positioning the imaging plate at a second manufacturing position relative to a second manufacturing device, wherein the second manufacturing device comprises a second projector and a second optical train;
projecting a second test image from the second projector through the second optical train onto the surface comprising the contrasting image such that the second test image is positioned with the contrasting image on the surface of the imaging plate; and
calibrating at least one of the second projector or the second optical train based on registration between the second test image and the contrasting image.

7. The method of claim 6, further comprising manufacturing the solid part with the first manufacturing device by interpreting images from a first electronic build file, and manufacturing a second solid part with the second manufacturing device by interpreting images from a second electronic build file that comprises identical build data to the first electronic build file.

8. The method of claim 1, wherein the test image comprises a fixed grid.

9. The method of claim 8, further comprising manufacturing the solid part with the manufacturing device by projecting images onto a photo-curable substrate after calibrating the at least one of the projector or the optical train.

10. The method of claim 9, wherein the fixed grid comprises a pattern resolution determined in response to a manufacturing tolerance of the solid part.

11. The method of claim 1, further comprising repeating the positioning, projecting, and calibrating in response to a calibration trigger.

12. The method of claim 11, wherein the calibration trigger comprises an event selected from the events consisting of: an initial acquisition of the manufacturing device, a movement of the manufacturing device, an initial acquisition of a build file, a change in a build file, a replacement of a component of the manufacturing device, an off-nominal test of a component built by the manufacturing device, an elapsed time threshold since a last calibration event, and an elapsed number of components manufactured since a last calibration event.

13. An apparatus comprising:
a manufacturing device including a projector and an optical train;
an imaging plate comprising a surface comprising a contrasting image, wherein the surface is positioned at a manufacturing position relative to the manufacturing device; and
the projector being configured to project a test image through the optical train onto the surface comprising the contrasting image such that the test image is positioned with the contrasting image on the surface of the imaging plate;
a means for calibrating at least one of the projector or the optical train based on registration between the test image and the contrasting image to achieve a proper magnification, skew, and parallelism of the test image in relation to the contrasting image before manufacturing a solid part with the manufacturing device,
wherein the means for calibrating at least one of the projector or the optical train comprises a means for tuning the magnification, skew, and parallelism of the test image in relation to the contrasting image until registration between the test image and the contrasting image on the surface of the imaging plate is achieved.

14. The apparatus of claim 13, wherein the contrasting image comprises a negative of the test image.

15. The apparatus of claim 13, wherein the test image comprises a fixed grid.

16. The apparatus of claim 13, wherein the manufacturing position comprises a first manufacturing position, wherein the manufacturing device comprises a first manufacturing device, wherein the projector comprises a first projector, wherein the optical train comprises a first optical train, the method, and wherein the means for calibrating comprises a first means for calibrating, further comprising a second manufacturing device including a second projector and a second optical train, the imaging plate being positioned at a second manufacturing position relative to the second manufacturing device, and a second means for calibrating at least one of the second projector or the second optical train based on registration between a second test image and the contrasting image to achieve a proper magnification, skew, and parallelism of the second test image in relation to the contrasting image.

17. The apparatus of claim 16, wherein the solid component comprises a first solid component, the apparatus further comprising the first solid component manufactured on the manufacturing device from a first electronic build file, a second solid component manufactured on the second manufacturing device from a second electronic build file, and wherein the first and second electronic build files comprise identical build data.

18. The apparatus of claim 17, wherein the first solid component and the second solid component comprise identical part numbers.

19. The method of claim 17, wherein the first solid component and the second solid component comprise identical physical parts within a specified tolerance.

20. A method for calibrating a manufacturing device structured to manufacture a solid component by projecting images onto a photo-curable substrate, the method comprising:

positioning an imaging plate at a manufacturing position relative to a manufacturing device, wherein the manufacturing device comprises a projector and an optical train, and wherein the imaging plate comprises a surface comprising a contrasting image;

projecting a test image from the projector through the optical train onto the surface comprising the contrasting image such that the test image is positioned with the contrasting image on the surface of the imaging plate;

calibrating at least one of the projector or the optical train based on registration between the test image and the contrasting image, wherein calibrating the at least one of the projector or the optical train comprises tuning magnification, skew, and parallelism of the test image in relation to the contrasting image until registration between the test image and the contrasting image on the surface of the imaging plate is achieved; and manufacturing the solid component with the manufacturing device after the calibrating.

21. The method of claim 20, wherein the solid component comprises a first solid component, wherein the manufacturing position comprises a first manufacturing position, wherein the manufacturing device comprises a first manufacturing device, wherein the projector comprises a first projector, and wherein the optical train comprises a first optical train, the method further comprising positioning the imaging plate at a second manufacturing position relative to a second manufacturing device, wherein the second manufacturing device comprises a second projector and a second optical train, projecting a second test image from the second projector through the optical train onto the surface comprising the contrasting image such that the second test image is positioned with the contrasting image on the surface of the imaging plate, and calibrating at least one of the second projector or the second optical train based on registration between the second test image and the contrasting image, and manufacturing a second solid component with the second manufacturing device after the calibrating the at least one of the second projector and the second optical train.

22. The method of claim 21, wherein the first solid component and the second solid component are manufactured from electronic build files comprising identical build data.

* * * * *